United States Patent [19]

Nakamura et al.

[11] Patent Number: 4,713,621
[45] Date of Patent: Dec. 15, 1987

[54] PHASE SYNCHRONIZATION CIRCUIT

[75] Inventors: Haruhiko Nakamura, Yokohama; Junya Tempaku, Yokosuka, both of Japan

[73] Assignee: Fujitsu Limited, Kanagawa, Japan

[21] Appl. No.: 717,198

[22] Filed: Mar. 28, 1985

[30] Foreign Application Priority Data

Mar. 29, 1984 [JP] Japan .................. 59-059466

[51] Int. Cl.⁴ .................. H03K 3/86; H03K 5/26
[52] U.S. Cl. .................. 328/55; 307/269; 307/409; 328/63; 328/72; 328/155
[58] Field of Search .................. 328/55, 56; 307/269, 307/409; 328/63, 72, 133, 179, 201, 155

[56] References Cited

U.S. PATENT DOCUMENTS

| | | | |
|---|---|---|---|
| 3,024,417 | 3/1962 | Secretan | 328/63 |
| 3,241,075 | 3/1966 | Chatelon | 328/110 |
| 3,502,991 | 3/1970 | Sampson | 328/56 |
| 3,624,519 | 11/1971 | Beydler | 328/56 |
| 4,023,110 | 5/1977 | Oliver | 328/55 |
| 4,061,975 | 12/1977 | Sugai | 307/445 |
| 4,386,323 | 5/1983 | Jansen | 375/108 |

FOREIGN PATENT DOCUMENTS

| | | |
|---|---|---|
| 0021942 | 7/1981 | European Pat. Off. . |
| 0180450 | 5/1986 | European Pat. Off. . |
| 2313827 | 12/1976 | France . |
| 58-202680 | 11/1983 | Japan . |
| 2069263 | 8/1981 | United Kingdom . |

*Primary Examiner*—John S. Heyman
*Attorney, Agent, or Firm*—Armstrong, Nikaido, Marmelstein & Kubovcik

[57] ABSTRACT

A phase synchronization circuit for controlling a graphic display device in a teletext receiving system. The phase synchronization circuit includes a delay circuit, adapted to delay in sequence clock signals which are to be phase-synchronized with a reference signal and to produce in sequence delayed clock signals, and a selection circuit, including set/reset circuits and gates, each gate receiving the output of the set/reset circuits and of the delayed clock signals. Among the delay clock signals, the signal that has the nearest edge timing to the edge of external signals is selected. The phase synchronization circuit has a short pull-in time and high-speed synchronization, is suitable for circuit integration, and offers improved reliability.

10 Claims, 9 Drawing Figures

PHASE SYNCHRONIZATION CIRCUIT

BACKGROUND OF THE INVENTION

1. Field of the Invention

The present invention relates to a phase synchronization circuit. The phase synchronization circuit according to the present invention may be used for a graphic display device in a teletext receiving system.

2. Description of the Related Art

In a graphic display system, in general, a clock pulse is produced phase-synchronized with a synchronizing signal of a television receiver. This clock pulse is used for reading picture data from a picture memory and preparing dot signals for displaying characters, etc. for input into the television receiver. It is necessary that the phase synchronization circuit used for such a graphic display system is improved in reliability and reduced in cost through large-scale integration.

At the same time, it is necessary that no falling out of synchronization is liable to occur and, if synchronization is lost, the pulling-in to synchronization is achieved in a short time.

Of the prior art phase synchronization circuits, the phased-locked loop (PLL) circuit is well known. A PLL circuit includes a voltage-controlled oscillator and a comparator. In the circuit, the phase difference between the input signal and the output of the voltage-controlled oscillator is compared by the comparator to generate a voltage proportional to the phase difference. The voltage is fed back to the voltage-controlled oscillator for the phase synchronization.

Accordingly, the PLL circuit is basically built on a feedback circuit. By enlarging the loop gain, it is possible to considerably reduce the phase difference between the input signal and the output signal.

However, since such a PLL circuit requires use of an integrated circuit (IC) for the feedback circuit, pull-in takes a longer time. Once synchronization has been lost for some reason, there is the disadvantage that it takes a long time, for example, several milliseconds, before the PLL circuit restores the synchronization state. Moreover, the PLL circuit requires external electronic components, for instance, capacitors, making complete circuit integration difficult, thus increasing the cost of the circuit and reducing reliability.

SUMMARY OF THE INVENTION

It is an object of the present invention to provide an improved phase synchronization circuit which solves the problems of the prior art.

It is another object of the present invention to provide an improved phase synchronization circuit with an extremely short pull-in time and thus high-speed phase synchronization.

It is a further object of the present invention to provide an improved phase synchronization circuit amenable to circuit integration and thus able to be reduced in cost and improved in reliability.

According to the present invention, there is provided a phase synchronization circuit for generating an output signal which is synchronized with a reference signal, the circuit including a delay circuit portion for delaying a clock signal. The delay circuit portion has a plurality of taps and being adapted to produce in sequence delayed clock signals having different phases from the plurality of taps. The phase synchronization circuit includes a selection circuit portion including set-reset circuits and gate circuits corresponding to predetermined taps of the delay circuit portion, each of the gate circuits receiving the output of one of the set/reset circuits and one of the delayed clock signals. The operation of the synchronization circuit is such that, when the potential of the reference signal is in one of the binary values, the set/reset operation of the set/reset circuits is carried out successively in accordance with the transmission of the clock signal through the delay circuit portion, while when the potential of the reference signal is changed to the other of the binary values, set/reset circuits other than the set/reset circuit which is set immediately before the change of potential are maintained in the reset state. The delayed clock signal of the corresponding tap of the delay circuit portion is delivered as the output signal through a gate circuit which receives the output of the set/reset circuit which is set immediately before the change of potential.

DESCRIPTION OF THE PREFERRED EMBODIMENTS

Figure 1:
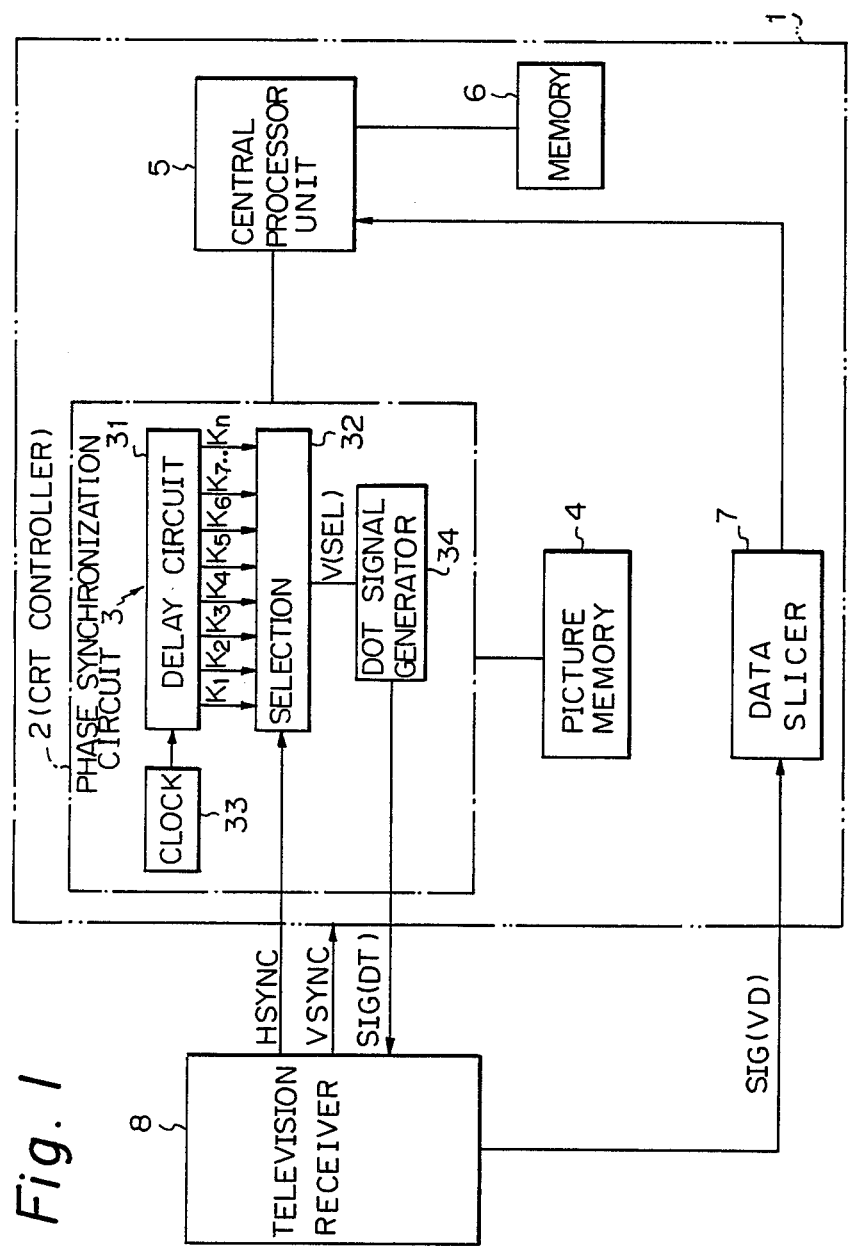
FIG. 1 is a schematic diagram of a teletext receiving system with the phase synchronization circuit according to an embodiment of the present invention.

FIG. 1 illustrates a teletext receiving system as one example of a device utilizing a phase synchronization circuit 3 of one embodiment in accordance with the present invention. As shown in the figure, the system includes a television receiver 8 including a television tuner, a display unit using a cathode ray tube (CRT), and the like, and a teletext adapter 1. The teletext adapter 1 is composed of a CRT controller 2, a picture memory 4 for storing a character code and so on, a central processor unit (CPU) 5, a processing memory 6 connected with the CPU 5, and a data slicer 7.

In the system as shown in FIG. 1, the picture signal SIG (VD) which is output from the television tuner contained in the television receiver 8 is input into the data slicer 7 in the teletext adapter 1, extracting teletext data to input it into the CPU 5. On the other hand, the CRT controller 2 is provided with a phase synchronization circuit 3 according to the embodiment of the present invention and produces a clock signal V (SEL) phase-synchronized with a vertical synchronization signal V sync and a horizontal synchronization signal H sync as a reference signal, both input from the television receiver 8. Based upon the teletext data, picture data is produced for storage into the picture memory 4 through the CRT controller 2. The CRT controller 2 reads the picture data stored in the picture memory 4 in synchronization with the clock signal and produces a dot signal SIG (DT) for input to the television receiver 8. Due to this input, characters and graphic figures are displayed on the display unit of the television receiver 8 in response to the teletext data.

Figure 2:
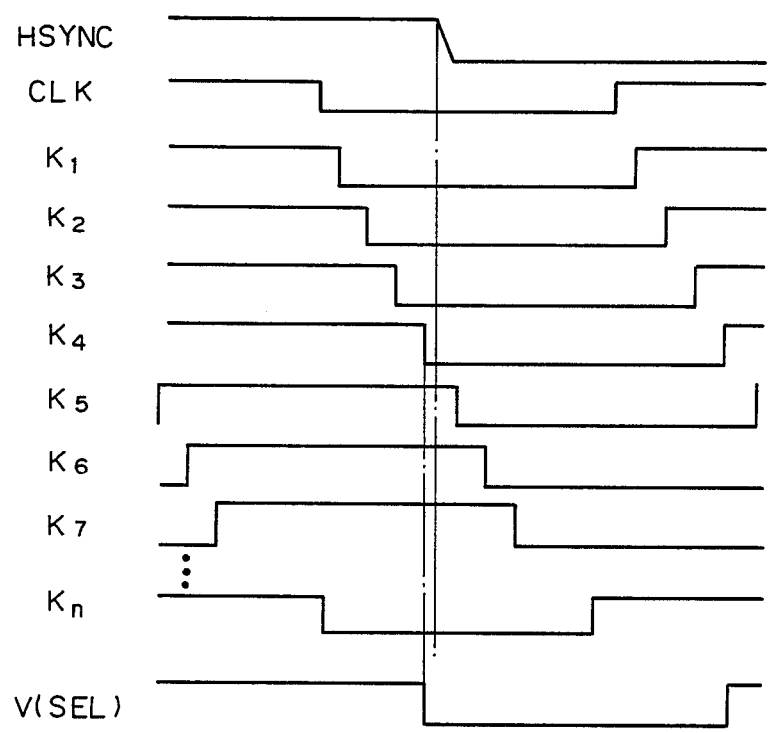
FIGS. 2, 3A, 3B, and 3C illustrate waveforms of the signals appearing in the system of FIG. 1.

FIG. 2 shows waveforms at each portion of the phase synchronization circuit 3 in FIG. 1. The phase synchronization circuit 3 is fundamentally composed of a delay circuit 31 and a selection circuit 32. The delay circuit 31 produces a clock signal CLK, for instance, a dot clock signal having a frequency of 7.2 MHz, delayed in sequence to produce in sequence clock signals $K_1$, $K_2$, $K_3$, ..., $K_n$ different in phase from each other.

In the phase synchronization circuit of FIG. 1, the selection circuit 32 is comprised of gate circuits and the like and employs no closed loop constitution as the conventional PLL circuit. It is therefore possible to considerably shorten the pull-in time. As shown in FIG. 2, the selection circuit 32 selects, from among the delayed clock signals $K_1$, $K_2$, $K_3$, ..., $K_n$, the signal which has the nearest edge timing to the edge before the trailing edge of the exterior signal such as, for instance, a horizontal synchronization signal H sync, that is to say, the delayed clock $K_4$ in the figure, thus output the same as the output clock V (SEL).

Figure 3A:
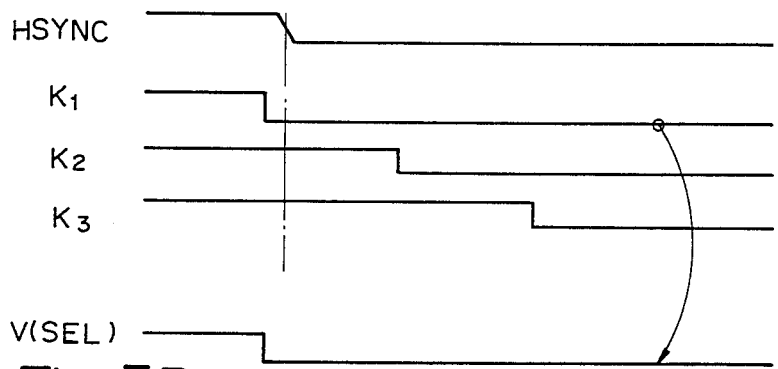
Figure 3B:
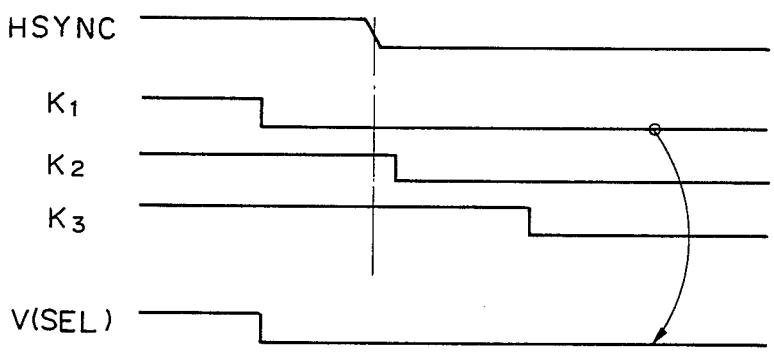
Figure 3C:
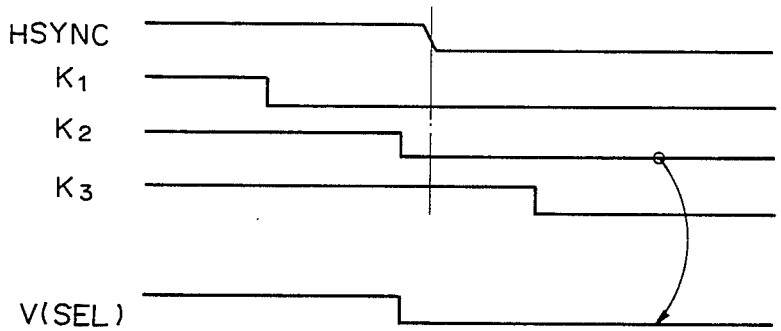

If the phase of H sync shifts, however, then the clock is selected in response to it. The operation of the selection circuit 32 is explained by use of the waveform diagrams in FIGS. 3A to 3C. For instance, if the H sync signal falls earlier than in the case of FIG. 2, that is to say, in the case of FIG. 3A, the signal $K_1$ falls immediately before the signal H sync falls, so $K_1$ is selected. If the phase of H sync is delayed from the case of FIG. 3A, that is to say, in FIG. 3B, the trailing edge of $K_2$ is nearer to the trailing edge of H sync than $K_1$. As the trailing edge of $K_2$ is located after that of H sync, however, $K_1$ is also selected as in FIG. 3A. If the phase of H sync is further delayed, that is to say, in FIG. 3C, the trailing edge of $K_2$ is immediately before that of H sync, so $K_2$ is selected.

Figure 4:
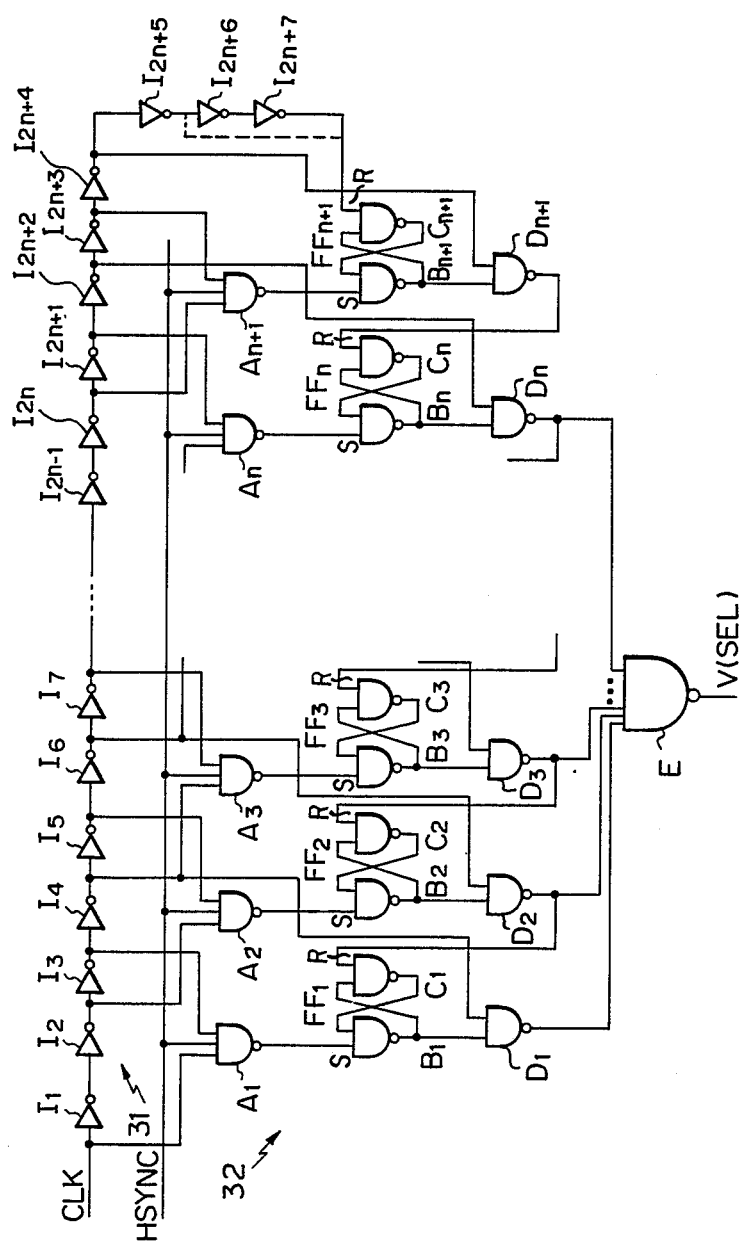
FIG. 4 shows the structure of the phase synchronization circuit in the system of FIG. 1.

FIG. 4 shows the detailed circuitry of the phase synchronization circuit of FIG. 1. In the circuit of FIG. 4, cascade-connected inverters $I_1$, $I_2$, $I_3$, ..., $I_{2n+7}$ form the delay circuit 31, while NAND gates $A_1$, $B_1$, $C_1$, $D_1$; $A_2$, $B_2$, $C_2$, $D_2$; ... $A_{n+1}$, $B_{n+1}$, $C_{n+1}$, $D_{n+1}$; and E form the selection circuit 32. Each four NAND gates surrounded by semi-colons among these NAND gates, except E, form each unit of the selection circuit. An external reference signal, for instance, a horizontal synchronizing signal H sync, is applied to one input of NAND gates $A_1$, $A_2$, $A_3$, ... $A_{n+1}$ in the input portion of each unit, while two other inputs are connected with each inverter forming a delay circuit by shifting by two units and extending over three units. A pair of NAND gates in each unit $B_1$, $C_1$; $B_2$, $C_2$; ... $B_{n+1}$, $C_{n+1}$ form respective SR flip-flops $FF_1$ through $FF_{n+1}$. One input of NAND gates $D_1$, $D_2$, ... $D_{n+1}$ at the output portion of each unit is connected with the output of each SR flip-flop FF(1) to FF(n+1) and the output of the inverter in the fourth unit of the delay circuit, while the output is connected with the input of the NAND gate E. The last unit forms a dummy circuit. The output of NAND gate $D_{n+1}$ in this unit is not input to the NAND gate E. A set input of the SR flip-flops in each unit is connected with the output of the NAND gates of the input portion in the same unit, while a reset input R is connected with the output of the NAND gate of the output portion in the following unit. However, the reset input R of SR flip-flops in the last unit, e.g., in the dummy circuit, is connected with the output of inverters $I_{2n+7}$ in the last unit of the delay circuit. Moreover, as shown by a broken line in FIG. 4, the last two inverters $I_{2n+6}$ and $I_{2n+7}$ in the delay circuit may be omitted to connect the reset input R with the output of the inverter $I_{2n+J}$. When the two inverters are omitted, however, the pulse width of the output of the NAND gate $D_{n+1}$ in the last unit, that is to say, the pulse width of the reset signal, is reduced, so it is necessary for each NAND gate forming the SR flip-flop of the former unit to be a high speed type.

Figure 5:
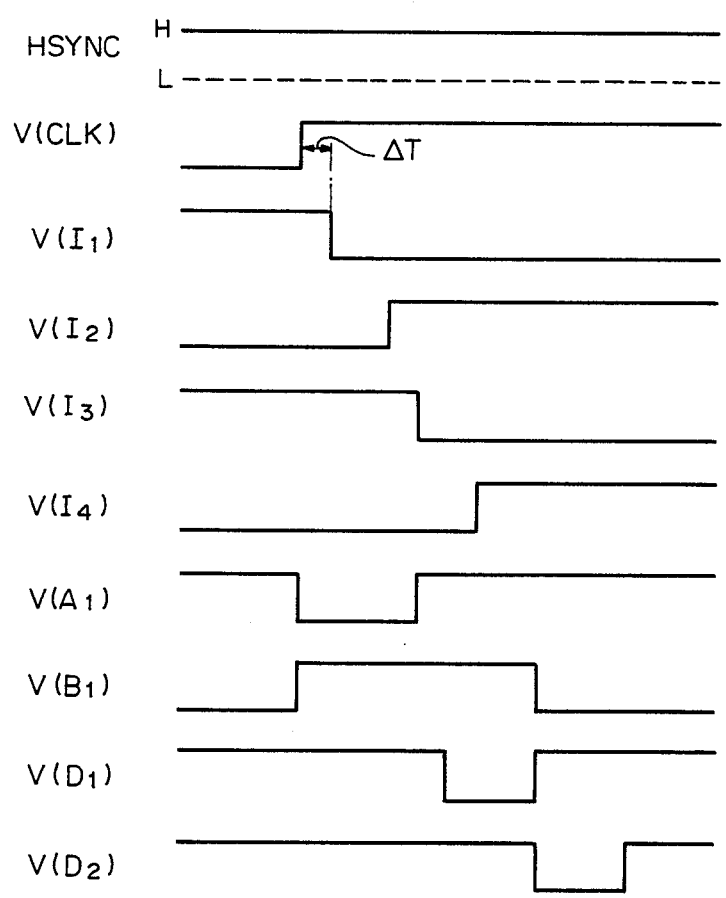
FIGS. 5, 6, and 7 illustrate waveforms of the signals appearing in the circuit of FIG. 4.

Next, the operation of the circuit in FIG. 4 will be explained referring to the waveforms in FIGS. 5 to 7. FIG. 5 illustrates the waveforms of each portion in case of a high level of the horizontal synchronizing signal H sync. As is shown at the V (CLK) through V ($I_4$) in FIG. 5, the waveforms of the input clock signal CLK and the output of each inverter $I_1$, $I_2$, $I_3$, $I_4$ are delayed by the time $\Delta T$ of one of the inverters, for instance, 10 nsec. In the circuit of the first unit, the output of the NAND gate $A_1$ is a low level only in the case of a high level of potential in both CLK and the output of $I_2$. The SR flip-flop $FF_1$ composed of the NAND gates $B_1$ and $C_1$ is set at the declining time of the $A_1$ output signal, so the potential of the outputting point of the SR flip-flop, i.e, that of the $B_1$ output, is raised in response to the last transition. As the potential of the output of the NAND gate $D_1$ in the output portion, i.e., that of the $D_1$ output, is a low level when both the potentials of the $B_1$ output and $I_4$ output are a high level, it becomes the low level when the potential of $I_4$ output changes from the low level to high level. In the same way, the $D_2$ output of the second stage of units falls when it is delayed by the equivalent of two gates from the $D_1$ output of the first stage of units, that is to say, by the equivalent of two inverters. Accordingly, the SR flip-flop of the first stage of units is reset when the $D_2$ output of the second stage of units falls. At this time, the $B_1$ output changes to the low level and the $D_1$ output changes to the high level. That is to say, the signal of the $D_1$ output at the first stage of units becomes a pulse of negative polarity having a time duration equivalent to the delay time of two gates. In the same way, the $D_2$ output of the second stage of units also has a time duration equivalent to a delay time of two gates and becomes a pulse of negative polarity which falls after the $D_1$ output signal has been risen.

Figure 6:
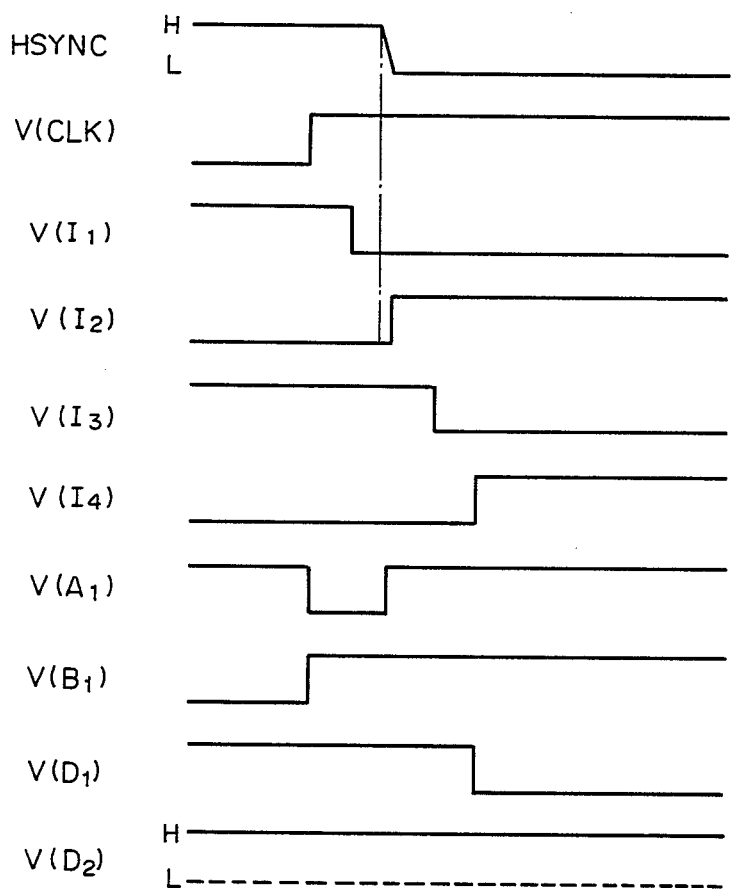

FIG. 6 shows the waveforms of each portion when the horizontal synchronizing signal H sync falls, for instance, at the neighboring point of time when the output of the inverter $I_2$, i.e., the $I_2$ output signal, rises. In this case, the $A_1$ output signal, i.e., the output of the NAND gate $A_1$ is the high level when the horizontal synchronizing signal H sync falls. The SR flip-flop of the first stage of units is set when the $A_1$ output signal falls, so, at that time, the $B_1$ output signal changes from the low level to the high level. The potential of $D_1$ output as the output of the NAND gate $D_1$ in the output portion changes to the low level when the potential of $I_4$ output rises. In this case, the output of the NAND gate $A_2$ in the input portion of the second stage of units is always the high level and, as the output of the SR flip-flop $FF_2$ composed of the NAND gates $B_2$ and $C_2$ remains at the low level, the potential of the $D_2$ output, i.e., the output of the second stage of units, is held at the high level. As the SR flip-flop of the first stage of units is not reset when the potential of the $D_2$ output is a high level, the potential of the $D_1$ output, i.e., the output of the first stage of units, is kept at the low level.

Figure 7:
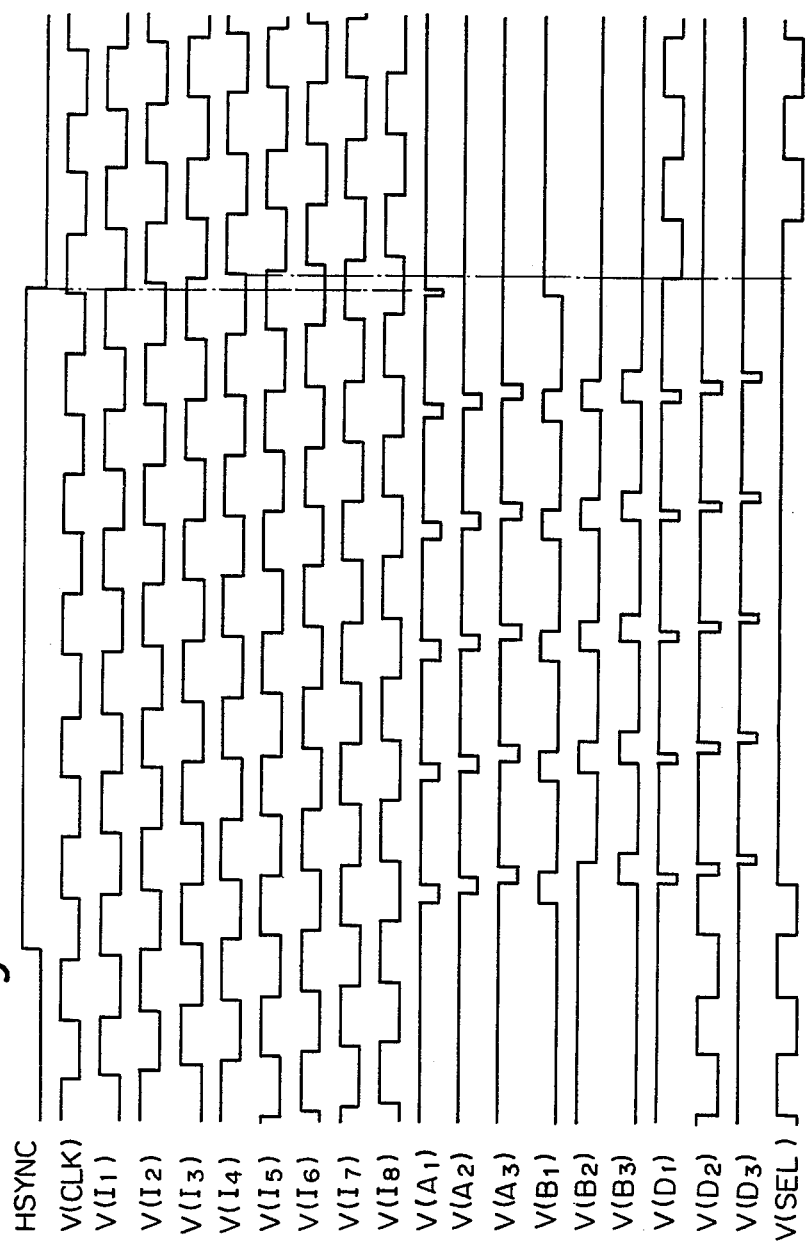

FIG. 7 illustrates the waveforms of each portion in the vicinity of the horizontal synchronizing signal H sync. For the duration of the horizontal synchronizing signal, that is to say, the period when the horizontal synchronizing signal H sync is a high level, as is apparent from FIG. 5, the outputs of each unit, $D_1$ output, $D_2$ output, and so on have waveforms which change to a low level in sequence by a time equivalent to the delay time per two gates. Thus, the output V (SEL) of the NAND gate E is a high level over nearly the whole period. As shown in FIG. 6, after the fall of the horizontal synchronizing signal H sync from a high level to a low level, only one among the SR flip-flops in each unit is in a set state, while the other SR flip-flops are in a reset state. Accordingly, the potential of the output of the SR flip-flop which have been in a set state, that is to say, that of the $B_1$ output, is a high level, while the output of all the other SR flip-flops is a low level. Thus, only one NAND gate, for instance, the NAND gate $D_1$, of the output portion in each unit outputs a clock pulse, while the output of all the other NAND gates is a high level. As a result, while the horizontal synchronizing signal H sync is a low level, the output V (SEL) of the NAND gate E is a signal which is the inverted signal of the clock pulse of $D_1$ output, that is, a signal of clock pulse of $I_4$ output. It is possible to obtain the clock pulse supplied to one input terminal of the NAND gate $D_1$ in the output portion from a tap of the delay circuit in accordance with a desired phase. In this way, during the period when the horizontal synchronizing signal H sync is a low level, after a definite phase of the clock pulse has been output from one unit, the clock pulse which has the nearest leading edge timing to the point of time of the trailing edge before the time when the following horizontal synchronizing signal H sync falls is selected and the signal V ($I_4$) output is as $K_{out}$.

From the above-described embodiment, the delay time of the delay circuit needs to be one period of time of the clock pulse. The number of gates in the plurality of inverters which constitute the delay circuit should be selected in consideration of the extent of operation and the allowance of phase error between the external signal and the output signal. According to the present invention, multi-stage inverters are employed in the delay circuit. It is not always necessary that the number of stages of multi-stage inverters be large, for instance, when applied to a CRT controller and the like. As long as the phase error creates no unnatural feature on the display screen, the number of stages of the multi-stage inverters in the delay circuit can be kept to a moderate extent and comparatively simple circuitry is sufficient. As an example, a phase error of ±20 ns or so is not a problem from the standpoint of vision. It is apparent that the phase synchronizing circuit in accordance with the present invention may be applicable to display of channel numbers in a television display controller (TVDC) to denote the channel number and the like on the screen of a picture tube.

We claim:

1. A phase synchronization circuit for generating an output signal which is synchronized with a reference signal, said circuit comprising:
    a delay circuit portion for delaying a clock signal, said delay circuit portion having a plurality of taps, said delay circuit producing delayed clock signals in sequence having different phases from said plurality of taps; and
    a selection circuit portion being connected to said plurality of taps of said delay circuit portion, said selection circuit portion for selecting one of a plurality of outputs from said plurality of taps, said selection circuit portion including a plurality of adjacent selection circuit units, each selection circuit unit comprises,
        a set/reset circuit having set and reset inputs and an output,
        a first gate circuit having a first input terminal connected with one of said plurality of taps, a second input terminal connected with another of said plurality of taps, a third input terminal for receiving said reference signal and an output terminal connected with the set input of said set/reset circuit, said first gate circuit supplying said set/reset circuit with a set signal when the inputs to said input terminals form a predetermined relationship,
        a second gate circuit having an input for receiving the output of said set/reset circuit and having another input for receiving the output of one of said delayed clock signals, wherein said set/reset circuit in a preceeding selection circuit unit of adjacent selection circuit units is reset by an output from said second gate circuit in a following selection circuit unit,
        said synchronization circuit operating such that, when a potential of said reference signal has a first binary value a set operation followed by a reset operation of said set/reset circuits is carried successively in accordance with the transmission of said clock signal along said delay circuit portion, and when the potential of said reference signal is changed to a second binary value, set/reset circuits, other than said set/reset circuit which was set immediately before said change of potential, are maintained in a reset state so that said delayed clock signal of a corresponding tap of said delay circuit portion is delivered to said output signal through said second gate circuit which receives the output of said set/reset circuit which is set immediately before said change of potential.

2. A phase synchronization circuit according to claim 1, wherein the period of the reference signal is selected to be longer than the period of the clock signal.

3. A phase synchronization circuit according to claim 1, wherein the entire delay by the delay circuit is selected to be equal or longer than the period of the clock signal.

4. A phase synchronization circuit according to claim 1 wherein said plurality of adjacent selection circuit units have following and preceeding selection circuit units, said first input terminal of said first gate circuit in said following unit of adjacent units is connected with a tap precedent to a tap to which said second input terminal of said first gate circuit in said preceeding unit is connected.

5. A phase synchronization circuit according to claim 1 wherein one input terminal of said second gate circuit in each of said selection circuit units is connected with a tap following a tap to which said second input terminal of said first gate circuit is connected.

6. A phase synchronization circuit according to claim 5, wherein one input terminal of said second gate circuit in a preceeding selecting circuit unit of adjacent selection circuit units is connected with a tap between taps to which said first and second input terminals in a following selection circuit unit of adjacent selection circuit units are connected.

7. A phase synchronization circuit according to claim 1 wherein said set/reset circuit in a last of a plurality of selection circuit units is to be reset by an output from a last tap of the plurality of taps of the delay circuit portion.

8. A phase synchronization circuit according to claim 1 further comprising a third gate circuit where the outputs of said second gate circuits of said selection circuit units are combined by said third gate circuit.

9. A phase synchronization circuit according to claim 1 wherein a signal supplied to said second input terminal of said first gate circuit is an inverted delay signal of the signal supplied to said first input terminal.

10. A phase synchronization circuit according to claim 1 wherein said delay circuit portion includes a plurality of serially connected inverters.

* * * * *

UNITED STATES PATENT AND TRADEMARK OFFICE
CERTIFICATE OF CORRECTION

PATENT NO. : 4,713,621

DATED : December 15, 1987

INVENTOR(S) : Haruhiko NAKAMURA et al

It is certified that error appears in the above-identified patent and that said Letters Patent is hereby corrected as shown below:

Claim 1, Column 5, line 59, "delay circuit" should read --delay circuit portion--.

Signed and Sealed this

Twelfth Day of July, 1988

Attest:

DONALD J. QUIGG

Attesting Officer

Commissioner of Patents and Trademarks